United States Patent [19]

Hsia et al.

[11] Patent Number: 4,894,802

[45] Date of Patent: Jan. 16, 1990

[54] NONVOLATILE MEMORY CELL FOR EEPROM INCLUDING A FLOATING GATE TO DRAIN TUNNEL AREA POSITIONED AWAY FROM THE CHANNEL REGION TO PREVENT TRAPPING OF ELECTRONS IN THE GATE OXIDE DURING CELL ERASE

[75] Inventors: Steve K. Hsia, Saratoga; Chan-Sui Pang, Sunnyvale, both of Calif.

[73] Assignee: Catalyst Semiconductor, Inc., Santa Clara, Calif.

[21] Appl. No.: 151,379

[22] Filed: Feb. 2, 1988

[51] Int. Cl.⁴ ............................ G11C 11/40; H01L 29/79
[52] U.S. Cl. ...................................... 365/185; 365/182; 357/23.5
[58] Field of Search .................... 365/104, 185, 182; 357/23.5

[56] References Cited

U.S. PATENT DOCUMENTS

| | | | |
|---|---|---|---|
| 4,668,970 | 5/1987 | Yatsuda et al. | 365/185 |
| 4,672,409 | 6/1987 | Takei et al. | 368/185 |
| 4,688,078 | 8/1987 | Hseih | 365/185 |

OTHER PUBLICATIONS

Samachisa, Gheorghe et al., "A 128K Flash EEPROM Using Double-Polysilicon Technology," IEEE Journal of Solid-State Circuits, vol. SC022, No. 5, Oct. 1987.

H. Kume et al., "A Flash-Erase EPPROM Cell With an Asymmetric Source and Drain Structure", IEEE Technical digest of IEDM 1987, pp. 560-563.

Satyen Mukherjee et al., "A Single Transistor EEPROM Cell and Its Implementation in a 512K CMOS EEPROM" IEEE Technical Digest of IEDM 1985, pp. 616-619.

Primary Examiner—Stuart N. Hecker
Assistant Examiner—Alfonso Garcia
Attorney, Agent, or Firm—Skjerven, Morrill, MacPherson, Franklin & Friel

[57] ABSTRACT

Disclosed is a nonvolatile memory cell which utilizes a tunnel window to discharge the floating gate at a location spacially displaced from the program path for the cell. Also disclosed is a process for making such a memory cell.

3 Claims, 5 Drawing Sheets

NONVOLATILE MEMORY CELL FOR EEPROM INCLUDING A FLOATING GATE TO DRAIN TUNNEL AREA POSITIONED AWAY FROM THE CHANNEL REGION TO PREVENT TRAPPING OF ELECTRONS IN THE GATE OXIDE DURING CELL ERASE

BACKGROUND OF THE INVENTION

1. Field of the Invention

This invention relates to electrically erasable programmable read-only memory (EEPROM) cells.

2. Description of the Prior Art

With conventional split gate flash EEPROM cells a problem exists with the write-erase endurance. In a conventional prior art split gate cell, the floating gate is charged with electrons by channel hot-electron programming and the floating gate is discharged by Fowler-Nordheim tunneling of electrons from the floating gate to the overlap area where the floating gate extends above the drain region. The floating gate is separated from the substrate surface and the drain region by gate oxide, and electrons are trapped in the gate oxide during both the program and erase functions. These trapped electrons produce an electric field which tends to inhibit the floating gate from being charged in the next program cycle since the electrons trapped in the oxide repel those which are being attracted to the floating gate in the next program cycle.

A typical prior art split gate flash EEPROM cell has been described in an article entitled "A 128K Flash EEPROM Using Double-Polysilicon Technology," by Gheorghe Samachisa et al., which appeared in the IEEE Journal of Solid-State Circuits, Vol. SC-22, No. 5, October 1987.

FIGS. 1 and 2 illustrate in simplified and greatly enlarged fashion a typical prior art split gate EEPROM such as that described in the above referenced article. Referring to FIG. 1, a single cell 1 of an EEPROM is shown in top plan view, which cell 1 includes floating gate 2 indicated by dashed lines and control gate 3 which is situated above floating gate 2. Also illustrated in FIG. 1 is drain contact 4. A cross section along lines A—A of FIG. 1 is illustrated in FIG. 2. Referring to FIG. 2, cell 1 is comprised of substrate 5 of semiconductor material having a P-type dopant. Formed in substrate 5 from the upper surface 6 is a drain region 7 of highly doped N-type material and a source region 8 also of highly N-doped material. Channel 9 extends between adjacent edges of source region 8 and drain region 7. Surface 6 of substrate 5 includes a first layer of insulating material 10, which may typically be silicon dioxide, insulating layer 10 forming what is known in the art as the gate oxide. As will be appreciated by reference to FIG. 2, floating gate 2 rests on gate oxide 10 and has one edge overlapping a portion of drain region 7. Formed over floating gate 2 and surface of select transistor channel region is a second insulating material 11 which would typically also be composed of silicon dioxide. Control gate 3 is positioned above channel 9, rests on second insulating layer 11 and has one edge which overlaps a portion of source region 8 and a second edge which extends above floating gate 2, with the overlying edge of control gate 3 generally being aligned with the rightmost edge of floating gate 2. Although not shown in FIG. 2 because of the way the cross section has been taken, field oxide 12 is provided on surface 6 and is indicated in FIG. 1 by the partial crosshatching of its exterior edges. It will be appreciated by reference to FIG. 1 that between the opposite edges of field oxide 12, floating gate 2 extends closely to surface 6 and accordingly overlies drain region 7 between the outer edges of field oxide 12. Similarly, control gate 3 follows the same contour and is positioned more closely to surface 6 between the edges of field oxide 12 above channel region 9.

In programming cell 1, source region 8 is grounded and a programming voltage $V_{pp}$ of approximately 12 to 13 volts is applied to control gate 3 and a drain voltage $V_d$ of approximately 10 volts is applied to drain region 7. Under these conditions, programming is accomplished by injection of hot-electron from the channel through gate oxide layer in response to a high applied drain voltage as shown in FIG. 2. This manner of programming is known in the art as channel hot-electron programming. To erase cell 1, control gate 3 is grounded and an erase voltage of approximately 15 or 16 volts is applied to drain region 7 and source region 8 is set to float. Under these conditions, electrons travel from floating gate 2 to drain region 7 by tunneling through gate oxide 10 via the path indicated by the arrow extending from floating gate 2 to drain region 7, thereby discharging floating gate 2. In this program/erase cycle, electrons are trapped in gate oxide 10 in the region where floating gate 2 overlaps drain region 7 and this produces the aforementioned deficiency in subsequent programming of cell 1. Also, discharge of floating gate 2 occurs along the length of floating gate 2 between the opposite edges of field oxide 12 above said drain region 7 and accordingly electrons become trapped in the entire overlap between floating gate 2 and drain region 7. Also, it will be appreciated that the paths for the electrons during programming and during erase coincide since current flow is to drain contact 4 which is centered on the opposite side of channel 9 from source region 8. The electrons trapped in gate oxide 10 create a repulsive electric field so that during hot electron programming additional time is required to bring floating gate 2 to the required charge level and hence programming efficiency, as well as the program/erase endurance, are both degraded.

Prior art stacked gate flash-erase EEPROM cells, such as the one described in an article entitled "A FLASH-ERASE EEPROM CELL WITH AN ASYMMETRIC SOURCE AND DRAIN STRUCTURE" by H. Kume et al. which appeared in the IEEE Technical Digest of IEDM 1987, pages 560–563, consists of a single floating gate transistor. In this type of cell, programming is achieved by hot-electron injection at the drain edge of the floating gate and erasure by Fowler-Nordheim tunneling of electrons from the floating gate to the source. Although this achieves separation of program and erase paths, charge trapping at the drain side of the floating gate transistor is responsible for threshold voltage ($V_t$) window closure during write/erase cycling. In addition, source erase without a select transistor will cause a false reading of the cell if the floating gate transistor's threshold voltage ($V_t$) goes negative. Also, as pointed out above, drain erase presents an endurance issue.

Another example of a stacked gate, flash erase single transistor EEPROM cell (which is programmed and erased in the same fashion as the immediately preceding cell) is described in an article entitled "A SINGLE TRANSISTOR EEPROM CELL AND ITS IMPLE- MENTATION IN A 512K CMOS EEPROM" by Satyen Mukherjee et al., which appeared in the IEEE Technical Digest of IEDM 1985, pages 616-619. The cell described in this article shares the same shortcomings as those of the device described in the immediately preceding article.

SUMMARY OF THE INVENTION

It is an object of the invention to provide a memory cell having improved programming efficiency and improved program/erase endurance.

A further object of the invention is to provide a process for producing a cell having increased programming efficiency and improved program/erase endurance.

In accordance with the invention, a nonvolatile memory cell is provided comprising a body of semiconductor material of first conductivity type; source and drain regions of second conductivity type extending into said body from a surface; a channel region extending to said surface between said source and drain regions; a first layer of insulating material on said surface above said source, drain and channel regions; a floating gate on said first layer of insulating material, said floating gate having one edge overlying a portion of said drain region with said one edge separated from said drain region by said first insulating layer by a first distance for a substantial portion of the overlying area; a portion of said first insulating layer having a reduced thickness in an area where said floating gate overlies said drain region whereby a portion of said floating gate is separated from said drain region by a distance less than said first distance; a second layer of insulating material covering said floating gate; and a control gate on said second layer of insulating material overlying said floating gate.

In accordance with another feature of our invention, a memory cell is provided as set forth above in which at least a portion of one edge of said control gate overlies a portion of said source region.

In accordance with another feature of the invention, a nonvolatile memory cell in accordance with the foregoing features is provided in which the floating gate and the control gate are comprised of polycrystalline silicon material.

In accordance with a further feature of the invention, a process is provided for producing a nonvolatile memory cell comprising the steps of providing a body of semiconductor material of first conductivity type; establishing source and drain regions of second conductivity which extend into said body from a surface, wherein said source and drain regions are spaced apart and define a channel region which extends to said surface between said source and drain regions; providing a floating gate above said surface and positioning said floating gate such that one edge overlies a portion of said drain region and the other edge extends above said channel region; providing a first layer of insulating material on said surface between said floating gate and said drain region, said first insulating layer having a first thickness in a portion of the area where said floating gate overlies said drain region and a second, greater thickness in the remaining area where said floating gate overlies said drain region; providing a second layer of insulating material covering said floating gate; and providing a control gate on said second layer of insulating material and overlying said floating gate.

In accordance with another feature of our invention, a process as set forth above is provided wherein the step of providing a control gate includes providing a control gate which overlies a portion of said channel region and a portion of said source region.

In accordance with yet another feature of the invention, a process for producing a nonvolatile memory cell is provided as set forth in the immediately preceding processes, wherein the floating gate and the control gate are comprised of polycrystalline silicon material.

BRIEF DESCRIPTION OF THE DRAWINGS

Other objects and advantages of the invention will become apparent from a study of the specification and drawings in which.

DETAILED DESCRIPTION OF THE INVENTION

Figure 1:
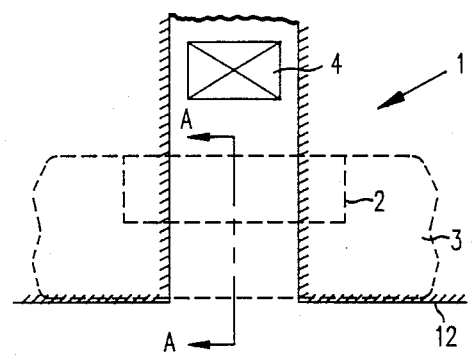
FIG. 1 is a top plan view of a prior art split gate memory cell.
Figure 2:
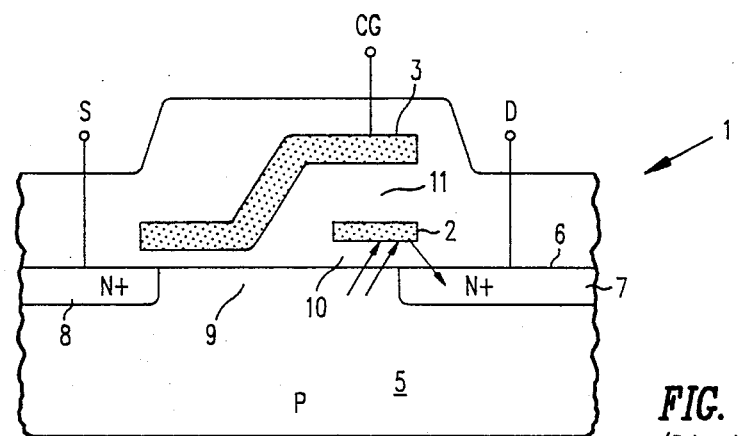
FIG. 2 is a cross section taken along lines A—A of FIG. 1.
Figure 3:
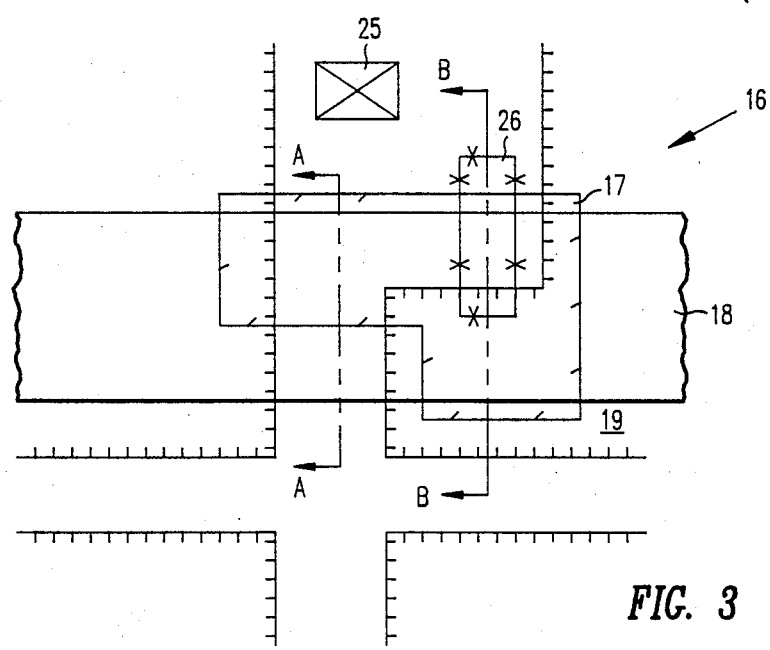
FIG. 3 is a top plan view of the memory cell of the present invention.
Figure 3A:
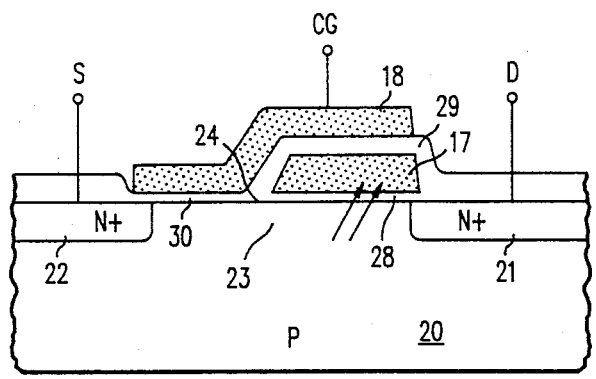
FIG. 3a is a cross section taken along lines A—A of FIG. 3.
Figure 3B:
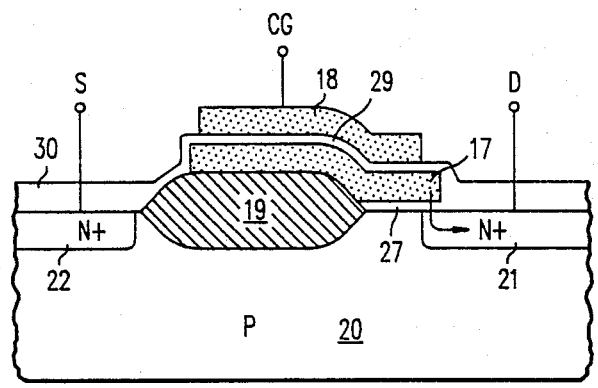
FIG. 3b is cross section taken along lines B—B of FIG. 3.

Referring to FIG. 3, memory cell 16 according to the invention is illustrated in top plan view and in highly enlarged version for the purposes of illustration. Memory cell 16 includes first layer of polycrystalline silicon material indicated at 17 which functions as the floating gate for the cell. Positioned above floating gate 17, and separated therefrom by a insulating material, is second layer polycrystalline silicon material 18 which functions as the control gate. FIGS. 3a and 3b are cross-sectional views taken along the line A—A and B—B, respectively, and will aid in an understanding of the invention. Field oxide 19 is grown on semiconductor body 20 and is illustrated in FIG. 3 and 3b, and in FIG. 3 the perimeter thereof is indicated by partial hatching. As will be appreciated by reference to FIG. 3a, one edge of floating gate 17 extends above and overlaps drain region 21. In addition, one edge of control gate 18 extends above floating gate 17 in the region adjacent drain region 21 and the opposite edge of control gate 18 extends above source region 22. Channel 23 extends to surface 24 of body 20 between drain region 21 and source region 22. Control gate 18 is formed over floating gate 17 to control the portion of channel 23 between floating gate 17 and source region 22 in order to achieve split gate operation. P-type body region 20 is preferably comprised of semiconductor material having a resistivity in the range of 10-30 ohm-centimeters. Source region 22 and drain region 21 are implanted in body 20 through upper surface 24, source and drain regions 22 and 21, respectively, being of highly N-doped material. Contact to drain region 21 is provided by drain contact 25 which is illustrated in FIG. 3. In accordance with our invention, we provide a tunnel window, indicated in FIG. 3 at 26, and in this tunnel window area, the oxide separating floating gate 17 from the drain region 21 overlap immediately therebelow has a thickness of approximately 150–200Å. Tunnel window oxide 27 (which is illustrated in FIG. 3b) provides a reduced oxide thickness to channel the flow of electrons from floating gate 17 to drain region 21 through the reduced thickness during erase of memory cell 16. The path of electron travel during erase is indicated by an arrow in FIG. 3b. In the remaining overlap portions of floating gate 17 above drain region 21, floating gate 17 is separated from the drain region 21 therebelow by first gate oxide 28 (illustrated in FIG. 3a), first gate oxide 28 having a thickness of approximately 300–350Å. First gate oxide 28 may be composed of a suitable insulator such as $SiO_2$. As will be noted from reference to FIG. 3a and 3b, interpoly oxide 29 and second gate oxide 30, which may be $SiO_2$ and of a thickness of approximately 450–500Å, and 400Å, respectively.

In operation, the memory cell 16 is programmed by grounding source region 22, applying programming voltage of approximately 12 to 13 volts to control gate 18 and applying a voltage of approximately 7 to 9 volts to drain region 21. This provides for channel hot-electron programming in which electrons travel from channel 23 across first gate oxide 28 to floating gate 17 in the path indicated by arrows in FIG. 3a. The path of channel electron flow is controlled by the location of drain contact 25. As can be observed by reference to FIG. 3, the drain contact 25 is placed off center such that the electron flow is directed whereby in its travel to drain contact 25 the path avoids crossing tunnel window oxide area 26. To erase cell 16, control gate 18 is grounded, a voltage of ±15 to 16 volts is applied to drain region 21 and source region 22 is set to float. During the erase operation, electrons from floating gate 17 tunnel through tunnel window oxide 27 to drain region 21 by the Fowler-Nordheim process, the path being indicated by the arrow in FIG. 3b. By separating the program and erase electron flow paths in the manner set forth above, the problem of trapping of electrons in the gate oxide, which reduces the ability to program quickly and thus reduces the program/erase endurance, has been alleviated.

Figure 4A:
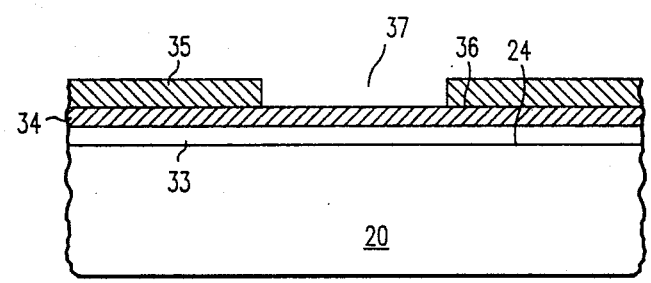
FIGS. 4a through 4k illustrate the process utilized in the invention for producing the tunnel window utilized in the erase mode.
Figure 4B:
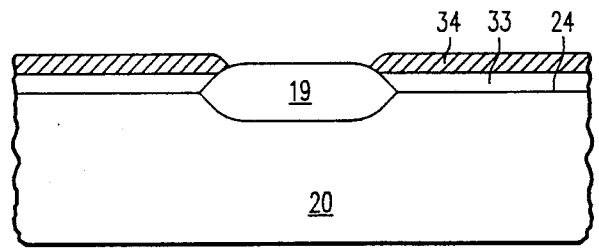
Figure 4C:
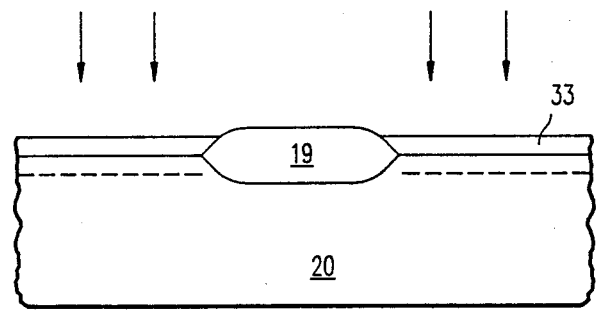
Figure 4D:
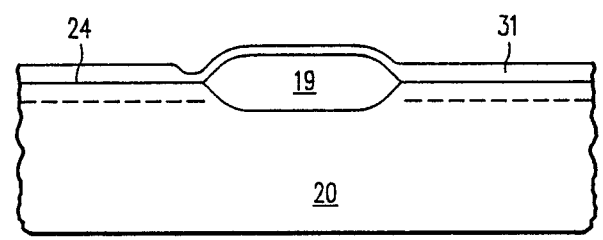
Figure 4E:
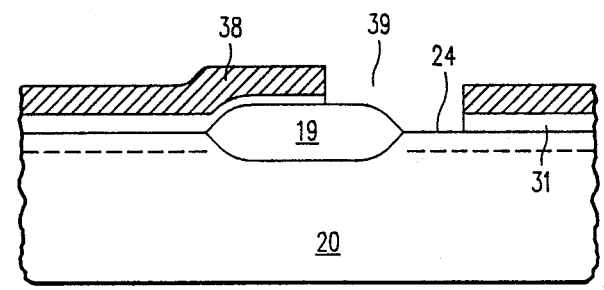
Figure 4F:
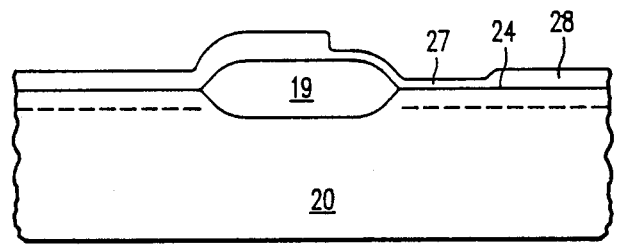

The process for producing cell 16, including tunnel window 26, will be illustrated in the following FIGS. 4a through 4k. The fabrication process of the area of device 16 illustrated in cross section A—A (as indicated in FIG. 3) is described in our copending U.S. patent application entitled "Split Gate EEPROM Cell With Source Erase", filed in the U.S. Patent and Trademark Office on Feb. 2, 1988, receiving Ser. No. 06/151,687, now U.S. Pat. No. 4,287,027 which is hereby incorporated herein by reference. Accordingly, the detailed description of that area of memory cell 16 will not be herein described. Turning to the tunnel window area 26 fabrication, it begins with steps shown in FIG. 4a which involve forming $SiO_2$ insulating layer 33 on surface 24 of body 20, insulating layer 33 being approximately 300Å in thickness and thereafter depositing insulating layer 34, preferably of $Si_3N_4$, to a thickness of about 1000 to 1500Å. Following the deposition of insulating layers 33 and 34 photoresist 35 is applied to surface 36 of insulating layer 34 and patterned to produce opening 37 extending down to surface 36. Opening 37 defines the area where field oxide 19 is desired to be established. Next, insulating layers 33 and 34 are etched down to surface 24 and field oxide 19 is grown in a steam atmosphere at a temperature from 950° C. to 1000° C. which produces the structure illustrated in FIG. 4b. Next, insulating layer 34 is removed, and boron is implanted through insulating layer 33 as illustrated in FIG. 4c. The boron is implanted at 40 KeV to a dosage of about $8 \times 10^{11}$ atoms/cm². Following the boron implant, as illustrated in FIG. 4c, insulating layer 33 is removed and a $SiO_2$ layer comprising first gate oxide 28 is grown on surface 24 of body 20. The initial part of producing gate oxide 28 is to deposit first insulating layer 31, preferably of $SiO_2$, which is grown to a thickness of approximately 200Å, the resulting structure being illustrated in FIG. 4d. Referring to FIG. 4e, second photoresist 38 is applied over insulating layer 31 and patterned as illustrated to define opening 39 having the dimensions of the desired tunnel window 26. Following the patterning, first insulating layer 31 is removed in the opening 39 area by etching first insulating layer 31 down to surface 24. Second photoresist 38 may also be referred to as the tunnel window mask since it is this photoresist which will define the tunnel window area. Etching first insulating layer 31 in opening 39 can be is performed using a standard wet etch solution such as a buffered oxide etch solution. After conclusion of the wet etch to remove first insulating layer 31 in the desired tunnel window area 26, second photoresist 38 is removed and a second growth of $SiO_2$ material is performed to produce the tunnel window oxide 27 to a thickness of approximately 150Å. During the tunnel window oxide growth, an addition of 100 to 150Å oxide is also grown over first insulating layer 31 which makes gate oxide 28 a total thickness of 300 to 350Å, as above mentioned. The resulting structure is shown in FIG. 4f.

Figure 4G:
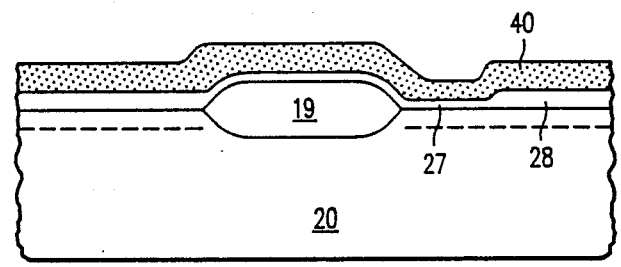
Figure 4H:
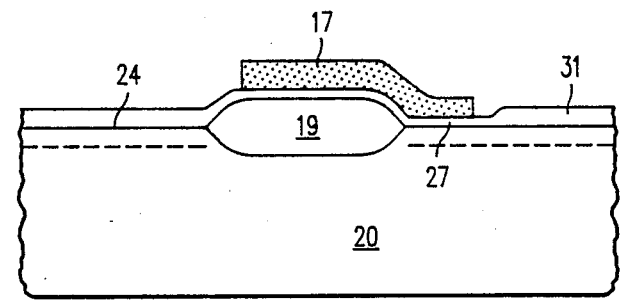

First polycrystalline silicon layer 40 is then deposited over the surface of first gate oxide 28 and tunnel window oxide 27 to cover the entire surface as illustrated in FIG. 4g. First polycrystalline silicon layer 40 will be masked and etched to produce floating gate 17 which will be described in subsequent steps. During the deposition of first polycrystalline silicon layer 40 it is desirable to dope with $POCl_3$ to a level of approximately $5-6 \times 10^{20}$ atoms/cm³. Following the doping of first polycrystalline silicon layer 40 a conventional photoresist is applied and patterned, after which a conventional etch is performed to produce floating gate 17 as illustrated in FIG. 4h.

Figure 4I:
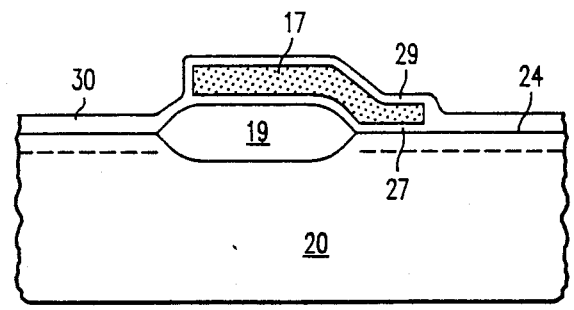
Figure 4J:
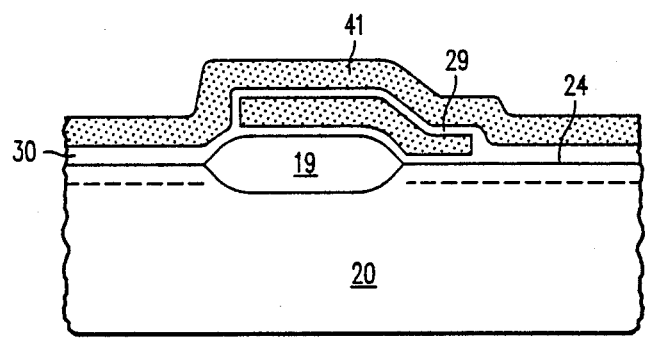
Figure 4K:
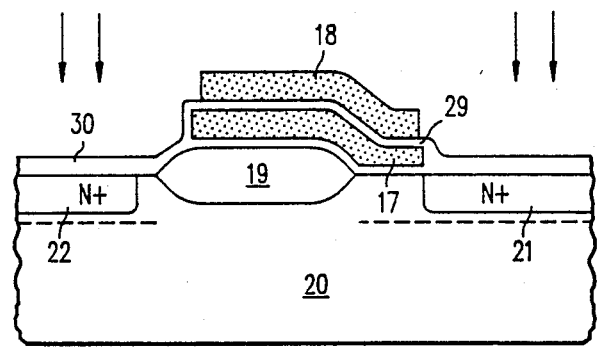

Next, all the oxide on surface 24 which is unprotected by floating gate 17 is removed down to surface 24, and then intepoly oxide 29 and second gate oxide 30 are grown. Second gate oxide 30, which can also be seen in FIG. 3a, is grown to a thickness of approximately 400Å above surface 24. Simultaneously, this second gate oxide growth process also produces a polysilicon oxide 29 of about 450 to 500Å directly above floating gate 17. The resulting structure is shown in FIG. 4i. Second polycrystalline silicon layer 41 is deposited over the entire surface, including second gate oxide 30, interpoly oxide 29, and field oxide 19 areas, to a thickness of approximately 4500Å and is doped with Phosphorus Oxychloride ($POCl_3$) to a doping concentration of $8-9 \times 10^{20}$ atoms/cm³ which produces the structure illustrated in FIG. 4j. A photoresist mask is then applied to the surface of second polycrystalline silicon layer 41, patterned by well known processes and etched to produce control gate 18 as illustrated in FIG. 4k. Next, the source and drain regions 22 and 21, respectively, are implanted using arsenic ions at 80 KeV and $5 \times 10^{15}$ atoms/cm². The cell is then completed by utilizing well known CMOS processes.

Although our invention has been described in connection with a split gate EEPROM, it is equally applicable to a stacked device. For example, referring to the article entitled "A FLASH-ERASE EEPROM CELL WITH AN ASYMMETRIC SOURCE AND DRAIN STRUCTURE" (which is cited in the above Description of the Prior Art), the flash EEPROM memory cell described therein was fabricated by using conventional self-aligned stacked gate technique, and utilizes erase through the source region to separate the electron flow paths for program and erase. Our invention can be also applied to such a self-aligned stacked gate flash EEPROM cell for erasure through drain region.

The foregoing description is illustrative of several ways in which our invention may be practiced. It is of course understood that the scope of our invention is not limited to the above description, but only to the following claims.

We claim:

1. A nonvolatile memory cell comprising:
   a body of semiconductor material of first conductivity type;
   source and drain regions of second conductivity type extending into said body from a surface;
   a channel region extending to said surface between said source and drain regions;
   a first layer of insulating material of a first thickness on said surface above said source, drain and channel regions;
   a tunnel window insulation area included on said surface and within said first insulating material, said tunnel window insulation area having a thickness less than said first thickness and said tunnel window insulation area having a portion extending above a portion of said drain region and a portion extending above said surface of the body adjacent to said drain region;
   a floating gate on said first layer of insulating material and over at least a portion of said tunnel window insulation area, said floating gate having one edge overlying a portion of said drain region with said overlying edge portion extending over said tunnel window insulation area thereby defining a floating gate to drain region tunnel area in which the floating gate is closer to said drain region than is the remaining portion of said floating gate edge overlying said drain region, said floating gate to drain tunnel area being positioned such that the distance from said source region to floating gate to drain tunnel area is greater than the shortest distance, measured across said channel region, between said source region and said drain region;
   a second layer of insulating material covering said floating gate; and
   a control gate on said second layer of insulating material overlying said floating gate.

2. A cell according to claim 1, wherein at least a portion of one edge of said control gate overlies a portion of said source region.

3. A cell according to claim 1 or 2, wherein said floating gate and said control gate are comprised of polycrystalline silicon material.

* * * * *